US011233581B2

(12) United States Patent
Bai et al.

(10) Patent No.: US 11,233,581 B2
(45) Date of Patent: Jan. 25, 2022

(54) BATTERY TRIGGERING FOR ACTIVATION OF AN OPTICAL DATA INTERCONNECT SYSTEM

(71) Applicant: WINGCOMM Co. Ltd., Nantong (CN)

(72) Inventors: Yun Bai, Beijing (CN); Wei Mao, Palo Alto, CA (US); Zuodong Wang, Beijing (CN)

(73) Assignee: WINGCOMM CO. LTD.

( * ) Notice: Subject to any disclaimer, the term of this patent is extended or adjusted under 35 U.S.C. 154(b) by 0 days.

(21) Appl. No.: 16/817,335

(22) Filed: Mar. 12, 2020

(65) Prior Publication Data
US 2020/0295846 A1     Sep. 17, 2020

Related U.S. Application Data

(60) Provisional application No. 62/817,286, filed on Mar. 12, 2019.

(51) Int. Cl.
*H04B 10/25*     (2013.01)
*H04B 10/80*     (2013.01)
(Continued)

(52) U.S. Cl.
CPC ........ *H04B 10/803* (2013.01); *G02B 6/4284* (2013.01); *H01S 5/026* (2013.01);
(Continued)

(58) Field of Classification Search
CPC .......... G02B 6/4284; H02J 7/007; H03F 3/50; H01S 5/026
See application file for complete search history.

(56) References Cited

U.S. PATENT DOCUMENTS 4,691,386 A    9/1987  Eumurian et al.
8,559,826 B2*  10/2013  Hongo .................. G09G 5/006
                                                          398/155
(Continued)

FOREIGN PATENT DOCUMENTS

CN    208158594 U    11/2018
CN    110572602 A    12/2019
CN    110572625 A    12/2019

OTHER PUBLICATIONS

Kaknevicius et al: "Managing Inrush Current", Texas Instruments Application Report, https://www.ti.com/lit/an/slva670a/slva670a.pdf?ts=1614450132107&ref_url=https%253A%252F%252Fwww.google.com%252F, May 2015 (Year: 2015).*

*Primary Examiner* — Li Liu
(74) *Attorney, Agent, or Firm* — David R. Stevens; Stevens Law Group

(57) ABSTRACT

A system for optical data interconnect of a source and a sink includes a first HDMI compatible electrical connector able to receive electrical signals from the source. A first signal converter is connected to the first HDMI compatible electrical connector and includes electronics for conversion of TMDS or FRL electrical signals to optical signals, with the electronics including an optical conversion device. At least one optical fiber is connected to the first signal converter. A second signal converter is connected to the at least one optical fiber and includes electronics for conversion of optical signals to differential electrical signals. A power module for the second signal converter includes a power tap connected to TMDS or FRL circuitry and a first voltage regulator connected to the power tap to provide power to an electrical signal amplifier. A rechargeable battery module is used to trigger power activation of connected ports, with the battery module being connected to the power tap. A second (Continued)

HDMI compatible electrical connector is connected to the second signal converter and able to send signals to the sink.

21 Claims, 11 Drawing Sheets

(51) Int. Cl.
  *H02J 7/00* (2006.01)
  *H03F 3/50* (2006.01)
  *G02B 6/42* (2006.01)
  *H01S 5/026* (2006.01)
  *H01S 5/183* (2006.01)

(52) U.S. Cl.
  CPC .......... *H01S 5/18302* (2013.01); *H02J 7/007* (2013.01); *H03F 3/50* (2013.01); *H04B 10/25* (2013.01); *H04B 10/808* (2013.01)

(56) References Cited

U.S. PATENT DOCUMENTS

| | | | | |
|---|---|---|---|---|
| 10,241,283 B1* | 3/2019 | Shen | .................... | G02B 6/4246 |
| 2003/0034963 A1* | 2/2003 | Moon | .................... | H04N 7/22 |
| | | | | 345/204 |
| 2005/0105913 A1* | 5/2005 | Ozeki | .................... | H04B 10/564 |
| | | | | 398/140 |
| 2006/0083518 A1* | 4/2006 | Lee | .................... | H04N 5/775 |
| | | | | 398/155 |
| 2006/0246772 A1* | 11/2006 | Yamaguchi | .................... | G02B 6/4416 |
| | | | | 439/505 |
| 2006/0280055 A1* | 12/2006 | Miller | .................... | G09G 5/006 |
| | | | | 369/44.11 |
| 2007/0010132 A1* | 1/2007 | Nelson | .................... | H01R 13/6658 |
| | | | | 439/577 |
| 2007/0233906 A1* | 10/2007 | Tatum | .................... | G09G 5/003 |
| | | | | 710/26 |
| 2007/0290728 A1* | 12/2007 | Tsai | .................... | H03K 5/12 |
| | | | | 327/170 |
| 2009/0001938 A1* | 1/2009 | Vantu | .................... | H02J 7/0036 |
| | | | | 320/165 |
| 2010/0165189 A1* | 7/2010 | Bae | .................... | H04B 3/44 |
| | | | | 348/441 |
| 2010/0316388 A1* | 12/2010 | Shastri | .................... | H04N 7/22 |
| | | | | 398/115 |
| 2011/0121656 A1 | 5/2011 | Hicks et al. | | |
| 2011/0129229 A1* | 6/2011 | Schemmann | .................... | H04B 10/807 |
| | | | | 398/137 |
| 2011/0268451 A1* | 11/2011 | Groepl | .................... | G09G 5/006 |
| | | | | 398/116 |
| 2012/0229706 A1* | 9/2012 | Kabuto | .................... | H04N 21/43635 |
| | | | | 348/723 |
| 2013/0077640 A1* | 3/2013 | Jiang | .................... | G02B 6/4249 |
| | | | | 370/464 |
| 2013/0183031 A1* | 7/2013 | Abe | .................... | H04B 10/2507 |
| | | | | 398/25 |
| 2013/0183045 A1* | 7/2013 | Niiho | .................... | H04B 10/25 |
| | | | | 398/142 |
| 2014/0250310 A1* | 9/2014 | Chepuri | .................... | G06F 1/26 |
| | | | | 713/300 |
| 2017/0134692 A1* | 5/2017 | Shimizu | .................... | H04B 10/077 |
| 2017/0346306 A1* | 11/2017 | Jung | .................... | H02J 7/042 |
| 2018/0005597 A1* | 1/2018 | Kumar | .................... | G09G 5/006 |
| 2018/0097565 A1* | 4/2018 | Parekh | .................... | G09G 5/006 |
| 2018/0332371 A1* | 11/2018 | Suzuki | .................... | H04Q 11/0005 |
| 2020/0233166 A1* | 7/2020 | Shimizu | .................... | H04B 10/40 |

* cited by examiner

BATTERY TRIGGERING FOR ACTIVATION OF AN OPTICAL DATA INTERCONNECT SYSTEM

CROSS-REFERENCE TO RELATED APPLICATIONS

This application claims priority to U.S. Provisional Patent Application Ser. No. 62/817,286, filed Mar. 12, 2019, titled "Battery Triggering For Activation Of An Optical Data Interconnect System" which is incorporated herein by reference in its entirety, including but not limited to those portions that specifically appear hereinafter, the incorporation by reference being made with the following exception: In the event that any portion of the above-referenced application is inconsistent with this application, this application supersedes the above-referenced application.

TECHNICAL FIELD

The present disclosure relates to system for optical interconnect. In particular, a system and method for emulating electrical HDMI interconnects with an optical system is described.

BACKGROUND

High Definition (HD) signals are typically transmitted from one system to another using cables carrying DVI (Digital Video Interface) or HDMI (High Definition Multimedia Interface) signals. Conventionally, DVI/HDMI signals are conveyed over copper cables using a form of differential signaling called Transition Minimized Differential Signaling (TMDS). In TMDS, video, audio, and control data can be carried on three TMDS data channels with a separate TMDS channel for clock information. Recently HDMI 2.1 introduced another differential signaling form called Fixed Rate Link (FRL) to replace TMDS for delivering higher uncompressed resolutions such as 8K60 Hz. Unfortunately, over long distances of (e.g. 5 meters or greater) the impedance of copper cable can cause a large signal loss resulting in artifacts such as pixelation, optical flashing or sparkling, or even loss of picture. These artifacts can be reduced by passive connection designs involved large or well shielded copper cables, but this is costly, bulky, and limits cable flexibility. Alternatively, active electronic modules such as signal boosters can be used to reduce signal loss, but these techniques are also costly and can result in introduction of signal errors.

SUMMARY

In one embodiment, a system for optical data interconnect of a source and a sink includes a first HDMI compatible electrical connector able to receive electrical signals from the source. A first signal converter is connected to the first HDMI compatible electrical connector and includes electronics for conversion of differential (including but not limited to HDMI standard TMDS or FRL) electrical signals to optical signals, with the electronics including an optical conversion device connectable to source ground to reduce noise. At least one optical fiber is connected to the first signal converter. A second signal converter is connected to the at least one optical fiber and includes electronics for conversion of optical signals to HDMI standard TMDS or FRL electrical signals. A power module for the second signal converter provides power to an electrical signal amplifier connectable to sink ground. A second HDMI compatible electrical connector is connected to the second signal converter and able to send signals to the sink.

In a method embodiment, operating an optical data interconnect system for a source and a sink can include the steps of providing a first HDMI compatible electrical connector able to receive electrical signals from the source. HDMI standard TMDS or FRL signals are converted to optical signals using a first signal converter connected to the first HDMI compatible electrical connector, with the first signal converter including an optical conversion device connectable to source ground to reduce noise. Optical signals can be sent along at least one optical fiber connected to the first signal converter. Optical signals are received and converted to HDMI standard TMDS or FRL electrical signals using electronics in a second signal converter connected to the at least one optical fiber. A power module for the second signal converter provides power to an electrical signal amplifier. A second HDMI compatible electrical connector is connected to the second signal converter and able to send signals to the sink.

In another embodiment, a system for optical data interconnect of a source and a sink includes a first electrical connector able to receive electrical signals from the source. A first signal converter is connected to the first electrical connector and includes electronics for conversion of electrical signals to optical signals, with the electronics including an optical conversion device connectable to source ground to reduce noise. At least one optical fiber is connected to the first signal converter. A second signal converter is connected to the at least one optical fiber and includes electronics for conversion of optical signals to electrical signals. A power module for the second signal converter provides power to an electrical signal amplifier. A second electrical connector is connected to the second signal converter and able to send signals to the sink.

In one embodiment, a system for optical data interconnect of a source and a sink includes a first HDMI compatible electrical connector able to receive electrical signals from the source. A first signal converter is connected to the first HDMI compatible electrical connector and includes electronics for conversion of HDMI standard TMDS or FRL electrical signals to optical signals, with the electronics including an optical conversion device. At least one optical fiber is connected to the first signal converter. A second signal converter is connected to the at least one optical fiber and includes electronics for conversion of optical signals to HDMI standard TMDS or FRL electrical signals. A power module for the second signal converter includes a power tap connected to HDMI standard TMDS or FRL circuitry and a voltage regulator connected to the power tap to provide power to an electrical signal amplifier. A second HDMI compatible electrical connector is connected to the second signal converter and able to send signals to the sink.

In a method embodiment, operating an optical data interconnect system for a source and a sink can include the steps of providing a first HDMI compatible electrical connector able to receive electrical signals from the source. HDMI standard TMDS or FRL signals are converted to optical signals using a first signal converter connected to the first HDMI compatible electrical connector, with the first signal converter including an optical conversion device. Optical signals can be sent along at least one optical fiber connected to the first signal converter. Optical signals are received and converted to HDMI standard TMDS or FRL electrical signals using electronics in a second signal converter connected to the at least one optical fiber. The second signal converter is powered using a power module to provide power to an electrical signal amplifier. A second HDMI compatible electrical connector is connected to the second signal converter and able to send signals to the sink.

In another embodiment, a system for optical data interconnect of a source and a sink includes a first electrical connector able to receive electrical signals from the source. A first signal converter is connected to the first electrical connector and includes electronics for conversion of electrical signals to optical signals, with the electronics including an optical conversion device. At least one optical fiber is connected to the first signal converter. A second signal converter is connected to the at least one optical fiber and includes electronics for conversion of optical signals to electrical signals. A power module for the second signal converter includes a power tap to provide power to an electrical signal amplifier. A second electrical connector is connected to the second signal converter and able to send signals to the sink.

In yet another embodiment, a system for optical data interconnect of a source and a sink includes a first HDMI compatible electrical connector able to receive electrical signals from the source. A first signal converter is connected to the first HDMI compatible electrical connector and includes electronics for conversion of HDMI standard TMDS or FRL electrical signals to optical signals, with the electronics including an optical conversion device. At least one optical fiber is connected to the first signal converter. A second signal converter is connected to the at least one optical fiber and includes electronics for conversion of optical signals to HDMI standard TMDS or FRL electrical signals. A power module for the second signal converter includes a power tap connected to HDMI standard TMDS or FRL circuitry and a first voltage regulator is connected to the power tap to provide power to an electrical signal amplifier. A rechargeable battery module is used to trigger power activation of connected ports, with the battery module being connected to the power tap. A second HDMI compatible electrical connector is connected to the second signal converter and able to send signals to the sink.

In a method embodiment, operating an optical data interconnect system for a source and a sink can include the steps of providing a first HDMI compatible electrical connector able to receive electrical signals from the source. HDMI standard TMDS or FRL signals are converted to optical signals using a first signal converter connected to the first HDMI compatible electrical connector, with the first signal converter including an optical conversion device. Optical signals can be sent along at least one optical fiber connected to the first signal converter. Optical signals are received and converted to HDMI standard TMDS or FRL electrical signals using electronics in a second signal converter connected to the at least one optical fiber. The second signal converter is powered using a power module to provide power to an electrical signal amplifier. A rechargeable battery module able to trigger HDMI power activation of connected HDMI standard TMDS or FRL ports is used, with the battery module being connected to the power tap. A second HDMI compatible electrical connector is connected to the second signal converter and able to send signals to the sink.

In another embodiment, a system for optical data interconnect of a source and a sink includes a first electrical connector able to receive electrical signals from the source. A first signal converter is connected to the first electrical connector and includes electronics for conversion of electrical signals to optical signals, with the electronics including an optical conversion device. At least one optical fiber is connected to the first signal converter. A second signal converter is connected to the at least one optical fiber and includes electronics for conversion of optical signals to electrical signals. A power module for the second signal converter includes a power tap to provide power to an electrical signal amplifier. A rechargeable battery module able to trigger power activation of connected ports is used, with the battery module being connected to the power tap. A second electrical connector is connected to the second signal converter and able to send signals to the sink.

In an embodiment, the optical conversion device is a laser device driver (LDD).

In an embodiment, at least one optical fiber is multi-mode optical fiber and can include four or more optical fibers.

In an embodiment, the first HDMI compatible electrical connector is able to transmit control or other signals from the source to the sink using at least one of an electrical and an optical connection to the second HDMI compatible electrical connector. Similarly, in some embodiments the second HDMI compatible electrical connector is able to transmit control or other signals from the sink to the source using at least one of an electrical and an optical connection to the first HDMI compatible electrical connector.

In an embodiment, the electrical signal amplifier of the second signal converter further includes a transimpedance amplifier (TIA).

In an embodiment, the first signal converter connected to the first HDMI compatible electrical connector further includes a photodetector, a VCSEL laser or LED diode and encoder/decoder to receive and transmit optical signals.

In an embodiment, the second signal converter connected to the second HDMI compatible electrical connector further includes a photodetector, a VCSEL laser or LED diode and encoder/decoder to receive and transmit optical signals.

In an embodiment, a direct electrical data connection is made between the first and second HDMI compatible electrical connectors.

In an embodiment, a direct electrical power connection is made between the first and second HDMI compatible electrical connectors.

In an embodiment, the power module is connectable to a second power port.

In an embodiment, the electrical signal amplifier is connectable to sink ground.

In an embodiment, the power tap includes an inductor.

In an embodiment, the power tap includes a ferrite bead.

In an embodiment, the rechargeable battery module further comprises a second voltage regulator to supply 5 volts to a 5V port on the HDMI connector of the sink device.

In an embodiment, the rechargeable battery module is disconnected from the second voltage regulator after power is received from the power tap.

In an embodiment, the rechargeable battery module is recharged by the power tap.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
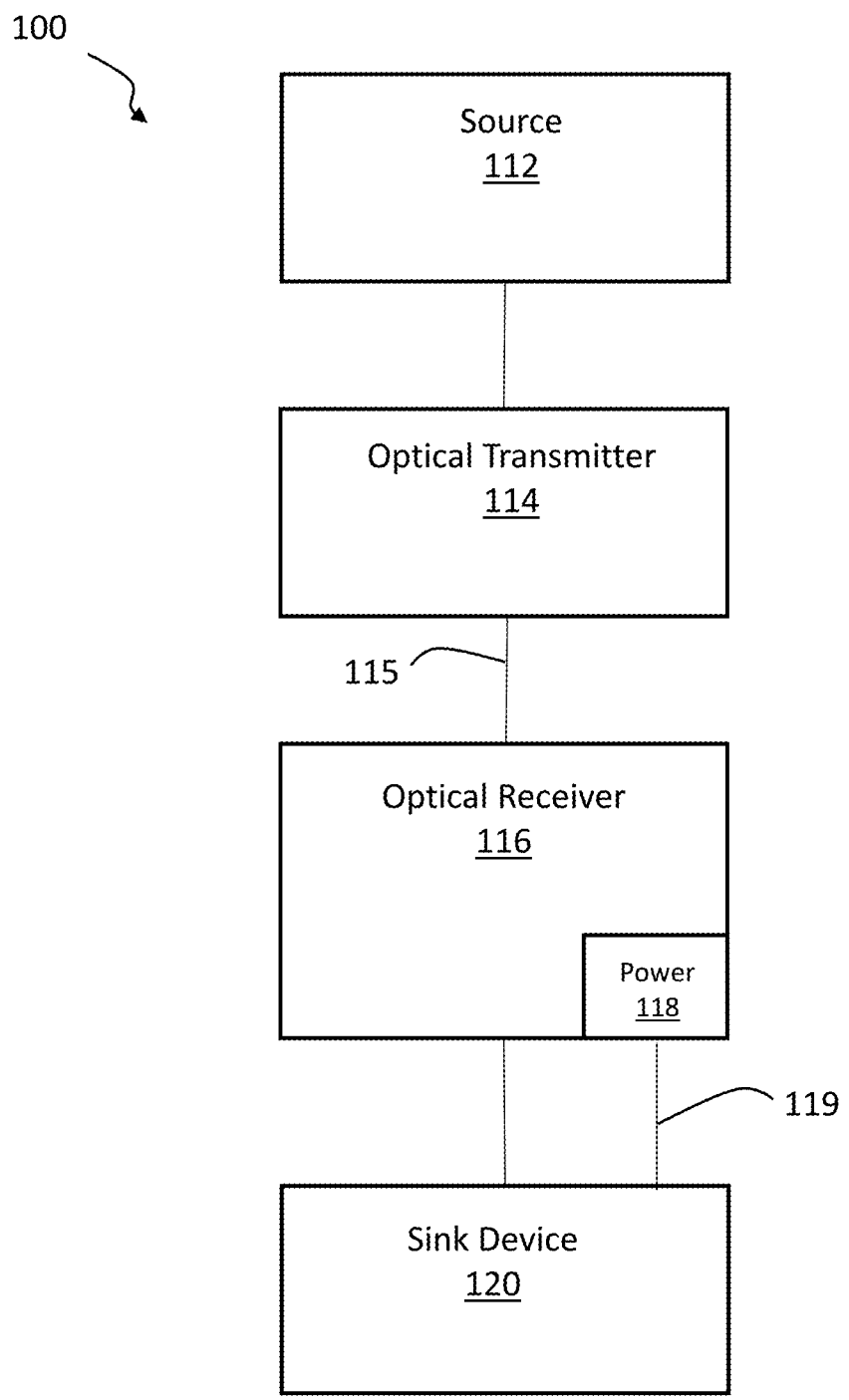
FIG. 1 illustrates an optical interconnect system.

As seen in FIG. 1, an optical interconnect system 100 capable of supporting conversion of electrical signals to optical signals, and back to electrical signals is illustrated. A signal source 112 is connected to an optical transmitter 114 that acts as a first signal converter to convert electrical signals received from the signal source 112 into optical signals. One or more optical fibers 115 are used to transfer optically encoded data to an optical receiver 116. The optical receiver decodes and acts as a second signal converter to convert the data to electrical signals that are provided to a sink device 120. The optical receiver 116 can include a separate power module 118, which in at least one embodiment is connected via electrical power connection 119 to the sink device.

Various signaling protocols are supported by the optical interconnect system. In some embodiments, electrical signals can be provided in a first protocol by source 112 and converted to a second protocol by the optical receiver 116. In other embodiments, electrical signals can be provided in a first protocol by source 112 and converted back to the same protocol by the optical receiver 116.

In one particular embodiment, HDMI 1.4b/1.4, HDMI 2.0b/2.0, HDMI 2.1, or other suitable HDMI protocols can be supported. HDMI 1.4b/1.4 supports 4K (3840×2160 pixels) video at 30 frames per second, while HDMI 2.0b/2.0 supports 4K video at 60 frames per second, with a bit rate of up to 18 Gbps. The latest HDMI 2.1 supports 8K video at 60 frames per second and 4K video at 120 frames per second, with a bit rate of up to 48 Gbps. HDMI is based on HDMI standard TMDS or FRL serial links for transmitting video and audio data. Typically, the HDMI interface is provided for transmitting digital television audiovisual signals from DVD players, game consoles, set-top boxes and other audiovisual source devices to other HDMI compatible devices, such as television sets, displays, projectors and other audiovisual devices. HDMI can also carry control and status information in both directions.

In other embodiments, other connectors and protocols can be supported, including but not limited to serial or parallel connectors, Digital Video Interface (DVI), other suitable connectors such as those based on LVDS, DisplayPort, USB-C or SATA In some embodiments, alternative encoding systems can be used. For example, TMDS serial links can be replaced with low density parity check (LDPC) code for video data. Alternatively, or in addition, a variable length and rate Reed-Solomon (RS) code can be used for audio and control information to provide error protection. Advantageously, such codes require no additional overhead for DC-balancing or transition minimization, resulting in an increased data rate as compared to TMDS encoded signals.

In one embodiment, source 112 can include, for example, DVD players, game consoles, smartphones, set-top boxes, telephones, computers, audio systems, or other network client devices. Source 112 can playback media data stored in a hard drive, a spinnable disk (e.g. Blu-ray or DVD), or held in solid state storage. In other embodiments, the source 112 can receive data through wired or wireless connection to cable providers, satellite systems, or phone networks. Similarly, sink device 120 can also be televisions, monitors, displays, audio systems, projectors, or other network client devices.

In one embodiment, the optical transmitter 114 can convert HDMI standard TMDS or FRL electrical signals using an optical conversion device connected to ground to reduce noise. Typically, this can be a laser diode driver (LDD). The optical conversion driver device can include an infrared or optical LED, semiconductor laser, or VCSEL device.

Advantageously, use of optical fiber 115 and elimination of electrical wired connection both provides electrical isolation and greatly improved signal. The optical fiber 115 is well suited for using consumer or household environments, as well as in electrically active, wet, or moist environments such as are found in industrial, manufacturing, automobile, trucking, shipping, and avionics. In one embodiment, the optical fiber 115 includes one or more multi-mode optical fibers protected by braided fiber or plastic sheathing or other suitable covering. If complete electrical isolation is not required, in another embodiment one or more low voltage electrical wires are also supported to provide power or control signals.

In one embodiment, the optical receiver 116 can convert optical signals to HDMI standard TMDS or FRL or other suitable electrical signals. The optical receiver 116 can include a photo detector and an optical receiver that convert light impulses to an electrical signal. In some embodiments, a transimpedance amplifier (TIA) or other suitable signal amplification system can be used to increase signal power, and a PD (photodiode) or an APD (avalanche photodiode) can be used to convert optical signals to electrical currents.

Power from power module 118 to operate the optical receiver 116 can be provided by connection to the sink device 120, by connection to a second power port or another external power source (not shown), or by an internal battery source. In some embodiments, a sink device can support multiple connector types (HDMI, DisplayPort, USB, USB-C, DC power connector) that can be used as external secondary power sources and/or internal battery charging stations. In those embodiments that support source HDMI to sink HDMI connections, both power to operate optical receiver 116 and additional power to emulate an electrical HDMI connection can be required since conventional HDMI connectable devices require a DC connection between the source 112 and a grounded sink device 120 to complete the circuit. This DC connection creates a current return path from the sink device 120 to the source 112. Since this connection is typically provided through internal shields covering the individual twisted wire pairs and a covering braid shield that are not available in a dedicated optical interconnect system, an additional power source is needed.

Figure 2:
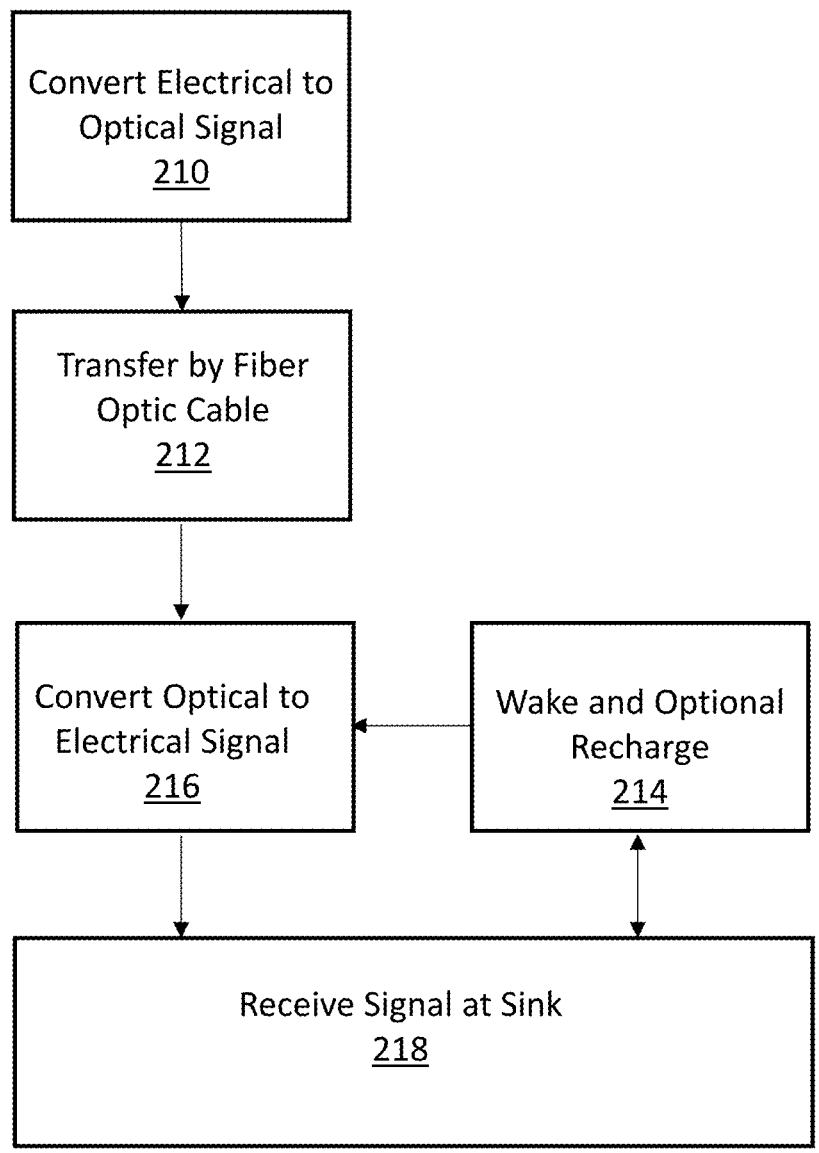
FIG. 2 illustrates a method of operating an optical interconnect system.

FIG. 2 illustrates a method 200 for interconnecting a source and a sink. Electrical signals from the source are converted to an optical signal (step 210) using a driver device for an infrared or optical LED, semiconductor laser, or VCSEL device. The optical signal is injected into a fiber optic cable and transferred (step 212). The transferred optical system is converted to an electrical signal (step 216) that is received by a sink (step 218). In order to ensure conversion of the electrical signal, plugging into the sink or connection to another external power source can supply power, wake signal conversion microprocessors or other electronics, and charge optional batteries (step 214).

Figure 3:
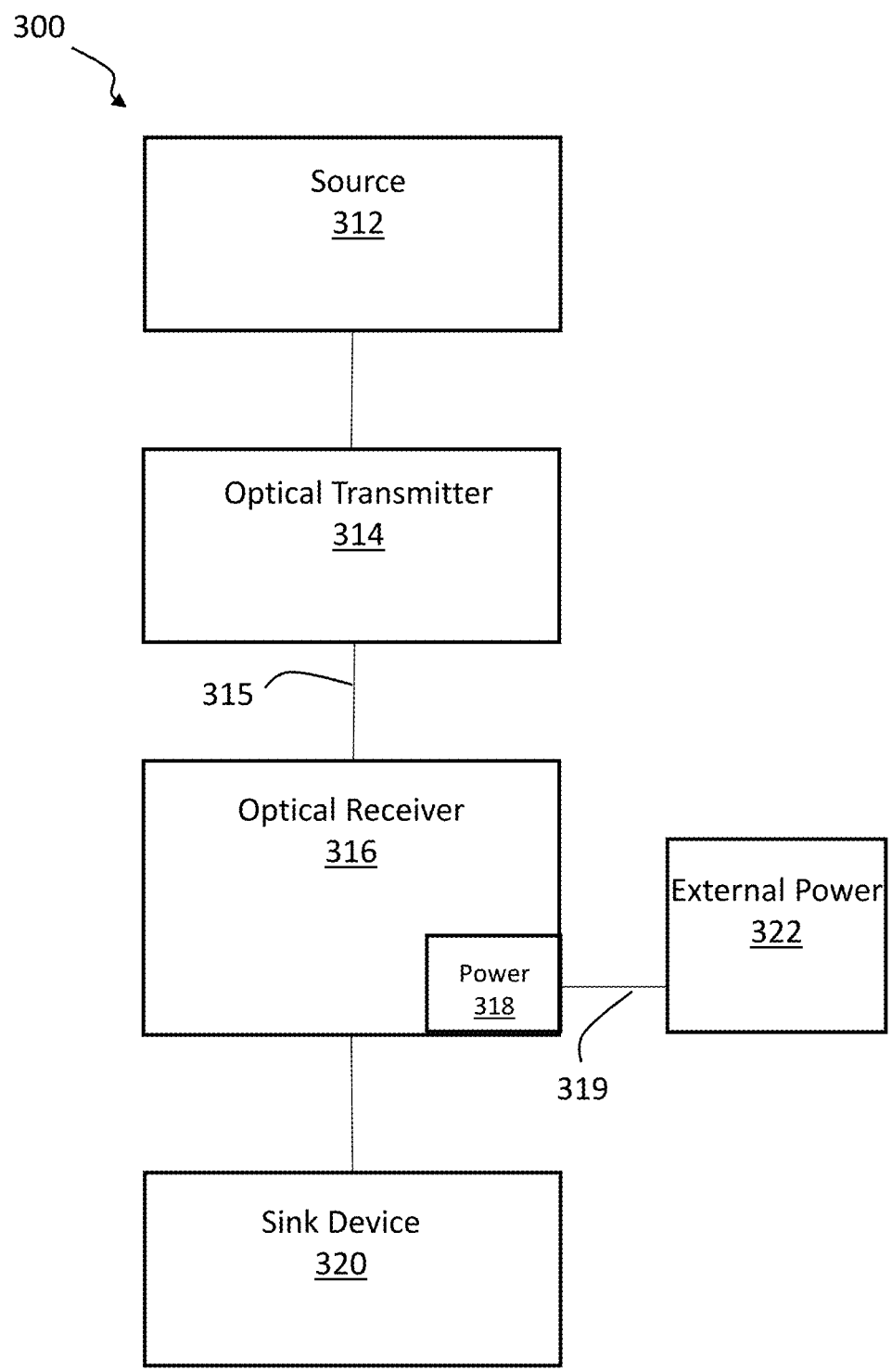
FIG. 3 illustrates an optical interconnect system with external power.

FIG. 3 illustrates an optical interconnect system with external power. In this embodiment a signal source 312 is connected to an optical transmitter 314 that converts electrical signals received from the signal source 312. One or more optical fibers 315 are used to transfer optically encoded data to an optical receiver 316. The optical receiver decodes and converts the data to electrical signals that are provided to a sink device 320. The optical receiver 316 can include a separate power module 318, which in at least one embodiment is provided by electrical power connection 319 to an external power module 322. In some embodiments the power module can be provided via other ports or power supplies on the sink device (e.g. a USB port), while in other embodiments power can be supplied by another device (e.g. a power over ethernet connection from a network switch) or a suitable direct power supply.

Figure 4:
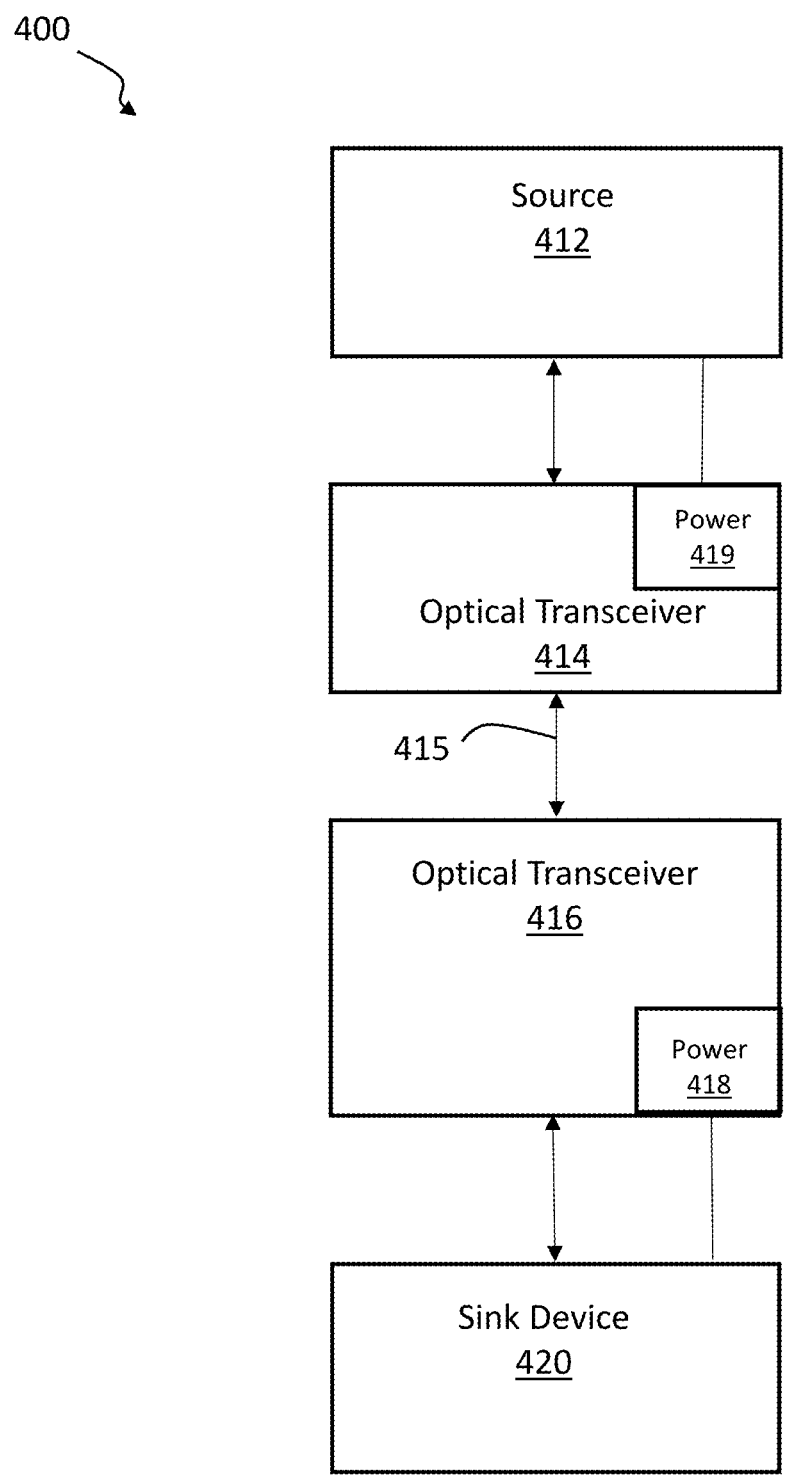
FIG. 4 illustrates a bi-directional optical interconnect system.

FIG. 4 illustrates a bi-directional optical interconnect system 400 capable of supporting conversion of electrical signals to optical signals, and back to electrical signals. In a first direction of data transfer, signal source 412 is connected to an optical transceiver 414 that converts electrical signals received from the signal source 412. One or more optical fibers 415 are used to transfer optically encoded data to an optical transceiver 416. The optical transceiver 416 decodes and converts the data to electrical signals that are provided to a sink device 420. A return signal from the sink device 420 to source 412 is also supported.

Both the optical transceiver 414 and 416 can include a respective separate power module 419 and 418. In at least one embodiment an electrical power connection can be made from power module 418 to the sink device 420. Similarly, an electrical power connection can be made to the source device 412 from the power module 419.

In one embodiment optical fiber can used for data transmission from the source device to the sink device. Additional optical fiber can be used for the transmission of a return signal from the sink device 420 to the source device 412. Such bi-directional signal functionality allows fuller support of the HDMI specification, including channels supporting low data-rate remote control commands, audio return from sink device to source, ethernet communication, and hot plug detection. Such data channels can include, but not limited to, a Consumer Electronics Control (CEC), an Audio Return Channel (ARC) or Enhanced Audio Return Channel (eARC), a HDMI Ethernet Channel (HEC) and a Hot Plug Detect (HPD). CEC allows a user to use a single remote to control multiple devices coupled together via HDMI cables. More specifically, a unique address is assigned to the connected group of devices, which is used for sending remote control commands to the devices. ARC or eARC is an audio link meant to replace other cables between sink device and source that allows source to reproduce the audio output from the sink device without using other cables. HEC enables IP-based applications over HDMI and provides a bidirectional Ethernet communication. HPD allows the source to sense the presence of sink device and reinitiates link if necessary.

Figure 5A:
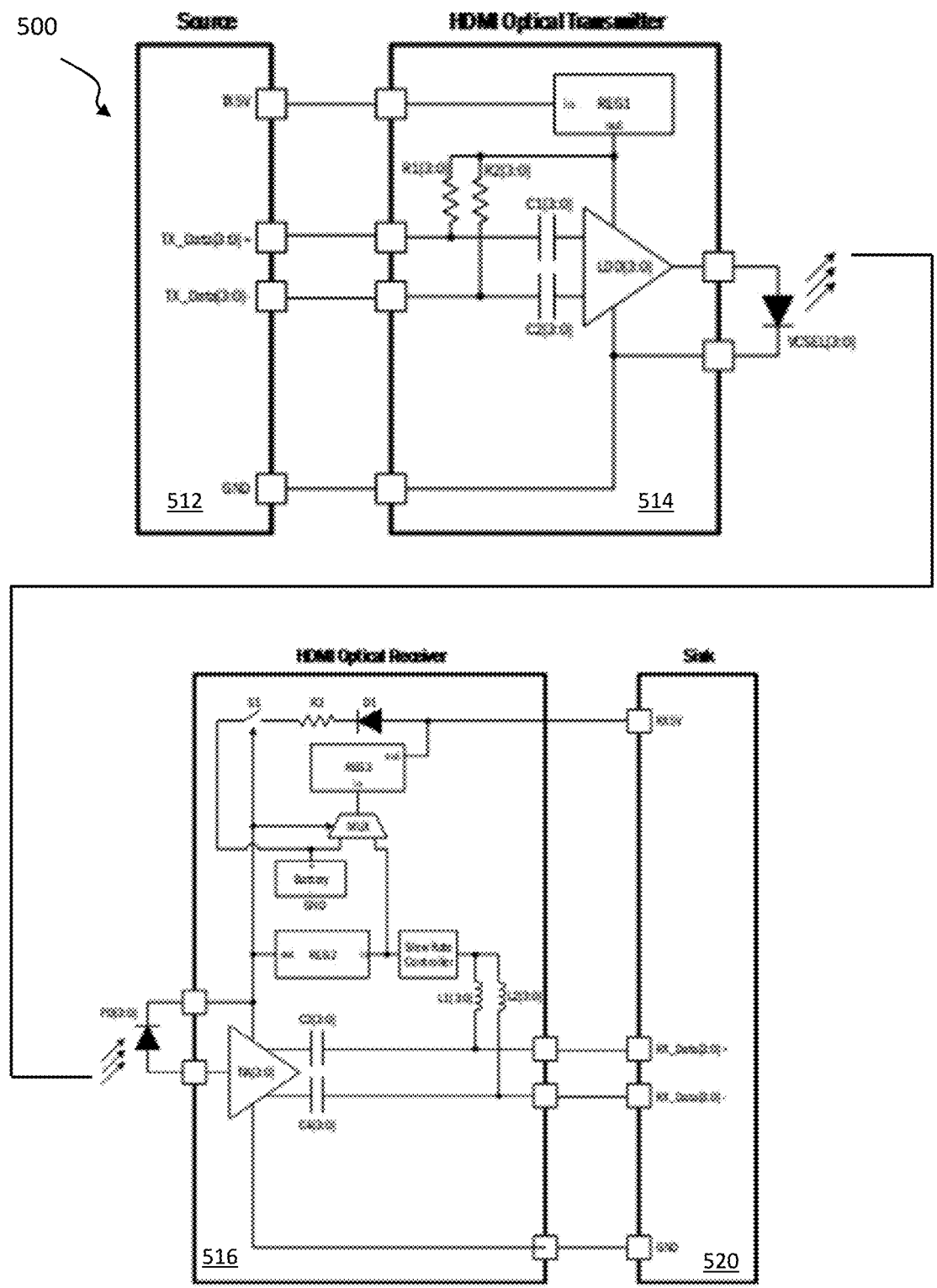
FIG. 5A illustrates one embodiment of an optical interconnect system that converts HDMI standard TMDS or FRL signals to optical signals and includes a rechargeable battery.

FIG. 5A illustrates one embodiment of HDMI optical fiber data connection system 500 that includes electrical to optical, and subsequent optical to electrical conversion. This embodiment can substantially replace a conventional electrical HDMI interface having two identical connectors attached to opposite ends of a cable. Such cables typically include four shielded twisted pairs of copper wires and seven separate copper wires for communicating various information. Four of the shielded twisted wire pairs are adapted to communicate relatively high-speed data and clock in the form of Transition Minimized Differential Signaling (HDMI standard TMDS or FRL). In HDMI 2.0b and previous HDMI standards, three pairs are used for communicating video, audio, and auxiliary data, and are typically referred to as D0-D2. The last pair is used for transmitting a clock associated with the data, and is typically referred to as CLK. In HDMI 2.1, all four pairs are used for communicating video, audio and auxiliary data, and are typically referred to as D0-D3. The speed of the high-speed data may range from 3 to 12 gigabits per second (Gbps) per lane. The remaining seven separate wires are used for communicating relatively low-speed data, such as in the range of 100 kilobits per second (kbit/s) to 400 kbit/s. Two of such wires are referred to as Display Data Channel (DDC) for providing communication between devices using a communication channel that adheres to an $I^2C$ bus specification. One of the DDC wire pair, typically referred to as DDC DATA, is used to communicate data between the devices. The other DDC wire pair, typically referred to as DDC CLK, is used to transmit a clock associated with the data. The other five of the seven separate wires are CEC, utility, HPD, 5V power and ground.

In operation, the respective HDMI standard TMDS or FRL, DDC, and other electrical signals from source 512 are provided to a transmitter 514 housed in an HDMI compatible connector. Using a laser diode driver (LDD) and a semiconductor laser or LED diode powered by voltage regulator REG1, an optical signal is generated and transferred to a photodetector and HDMI standard TMDS or FRL receiver 516 housed in another HDMI compatible connector. The HDMI standard TMDS or FRL receiver includes a transimpedance amplifier (TIA) connected to amplify the photodetector signal. The amplified electrical signals corresponding to the originally provided HDMI standard TMDS or FRL, DDC, and other electrical signals are sent to a television, display, or other suitable sink 520.

In one embodiment, electrical power is supplied to the HDMI standard TMDS or FRL receiver through an electrical tap of the HDMI standard TMDS or FRL port by inductors L1 and L2 (or other suitable electrical filtering circuit element such as ferrite beads) connected to a voltage regulator (REG2). The voltage regulator REG2 is connected to ground to reduce noise and acts to convert the voltage to the required operating voltage or voltages for a transimpedance amplifier that receives optical signals and converts them to electrical signals.

In some commercially available embodiments however, this mechanism will not work unassisted, since application of a specific voltage power is required to enable or otherwise trigger provision of power to the HDMI connection and connected electronics from sink 520.

For embodiments that require power triggering of the HDMI connection, a rechargeable battery, supercapacitor, or similar charge bank can be used to supply an initial 5-volt charge via regulator (REG3) to the 5V pin on the HDMI port (RXSV) of the sink 520. After triggering activation of the HDMI port, the electrical tap by inductors L1 and L2 (or other suitable electrical filtering circuit element such as ferrite beads) can be used to charge the battery or other power source. In operation, when the HDMI connector is not plugged into the sink 520, an enable pin "en" of REG3 is kept as open circuit and pulled to ground by resistor R4. Therefore, REG3 is turned off and thus does not draw current from the battery. When the HDMI connector is plugged into the sink 520 (e.g. a TV or display), the CEC pin or other appropriate pins, such as DDC, is connected to REG3 "en", which has certain voltage, e.g. 3.3V. REG3 is turned on and up-converts the battery voltage, e.g. 1.5V, to 5V. When the "5V" pin of the sink 520 is pulled to 5V, sink 520 starts to power the HDMI standard TMDS or FRL+ and HDMI standard TMDS or FRL− ports. Inductors L1 and L2 block the AC signal provided by HDMI standard TMDS or FRL data connections and pass through the DC voltage (e.g. 2V) from HDMI standard TMDS or FRL ports to REG2 "in". REG2 up-converts or down-converts this voltage to the necessary voltage or voltages for the TIA to operate. Once REG2 starts to output a voltage, it switches the MUX input so that REG3 "in" is connected to REG2 "in". It also closes switch Si and REG3 "out" starts to charge the battery.

Effectively, operation of the described circuit allows for the rechargeable battery supplying power to the 5V pin on the HDMI port of the sink 520 (RXSV) to be controlled to prevent battery dissipation when HDMI connector is unplugged. The rechargeable battery only operates when the cable is first plugged into the sink 520. After the sink 520 starts to power the HDMI standard TMDS or FRL ports, the rechargeable battery stops output current and instead is switched into a recharge mode.

Figure 5B:
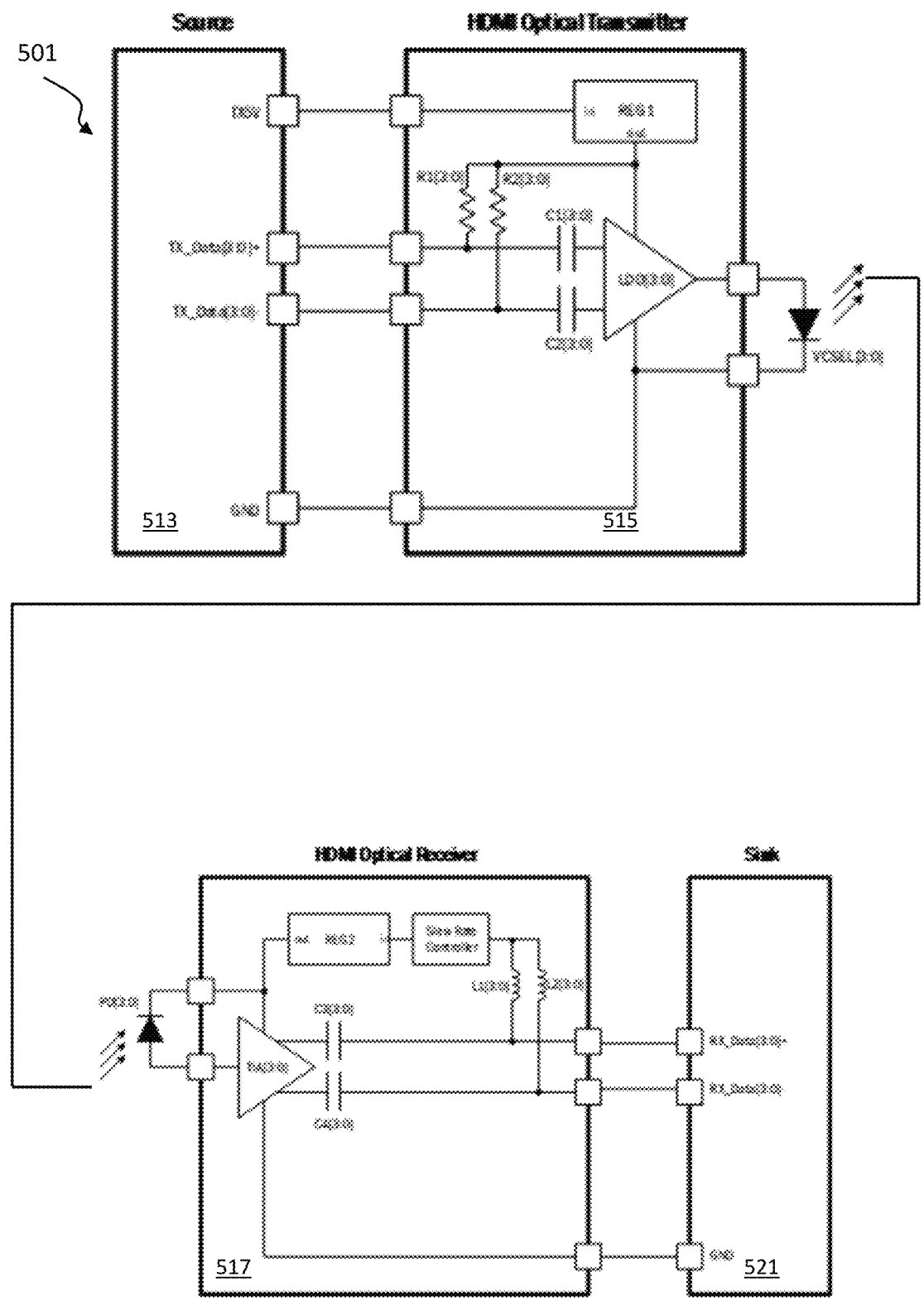
FIG. 5B illustrates one embodiment of an optical interconnect system that converts HDMI standard TMDS or FRL signals to optical signals that includes a power tapping circuit without a battery.

Alternatively, FIG. 5B illustrates one embodiment of an optical interconnect system 501 similar to that discussed with respect to FIG. 5A that converts HDMI standard TMDS or FRL signals to optical signals that includes a power tapping circuit without a battery. In operation, the respective HDMI standard TMDS or FRL, DDC, and other electrical signals from source 513 are provided to a transmitter 515 housed in an HDMI compatible connector. Using a laser diode driver (LDD) and a semiconductor laser or LED diode powered by voltage regulator REG1, an optical signal is generated and transferred to a photodetector and HDMI standard TMDS or FRL receiver 517 housed in another HDMI compatible connector. The HDMI standard TMDS or FRL receiver includes a transimpedance amplifier (TIA) connected to amplify the photodetector signal. The amplified electrical signals corresponding to the originally provided HDMI standard TMDS or FRL, DDC, and other electrical signals are sent to a television, display, or other suitable sink 521. In addition, the described circuit includes a slew rate controller to control ramp up time of current draw of REG2 from the power taps on the high speed differential signal RX Data[3:0]. If this ramp up time is too short, the DC voltage on RX Data[3:0] can drop to such a low level that REG2 stops working. This is prevented by the slew rate controller regulating the ramp up time to be slow enough to ensure the proper power tapping on RX Data[3:0].

Figure 5C:
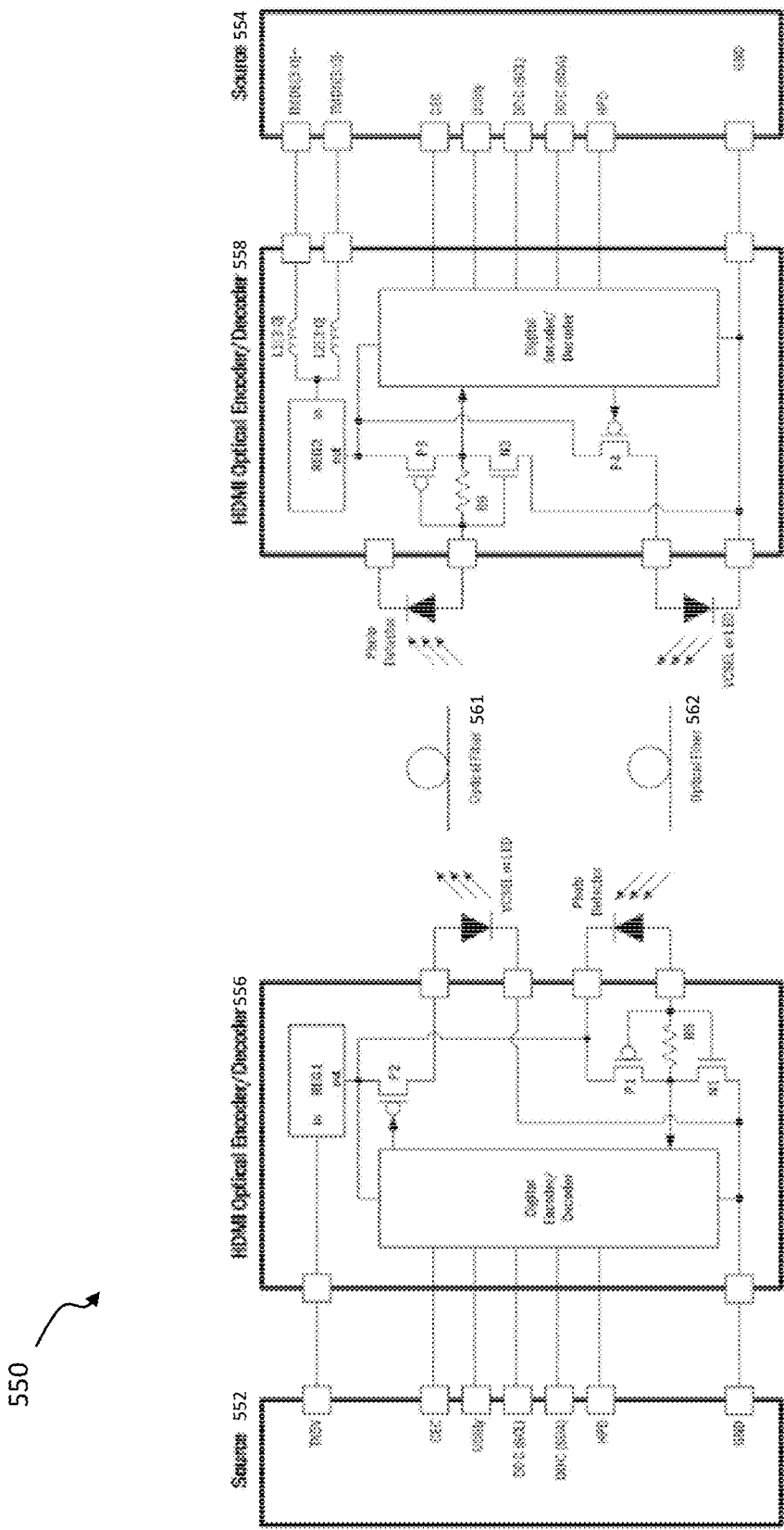
FIG. 5C illustrates one embodiment of an optical interconnect system that converts control or other signals to optical signals.

FIG. 5C illustrates one embodiment of an optical interconnect system 550 that converts both HDMI standard TMDS or FRL and control or other non-HDMI standard TMDS or FRL signals to optical signals. HDMI protocol requires bi-directional communication channels between source 552 and sink 554 for successful video/audio transmission and reception, which include but not limited to CEC, Utility, DDC (SCL), DDC (SDA), Ground, 5V Power and HPD. In the embodiment of FIG. 5B, all communication channels between source 552 and sink 554 are aggregated onto two optical fibers. An optical fiber 561 carries data from source 552 to sink 554, while an optical fiber 562 carries data from sink 554 to source 552, thus establishing bidirectional communication. Digital signal processing are realized by Digital Encoder/Decoder 1 (DED1 556) on the source side and Digital Encoder/Decoder 2 (DED 558) on the sink side. DED1 556 and 558 can either combine multiple communication channels into single aggregated channel or separate single aggregated channel into multiple communication channels. As illustrated, P2 is a current source that is powered by REG1 "out" and modulated by DED1 and drives a VCSEL or LED diode. REG1 in FIG. 5B operates in a manner similar to REG 1 as seen in FIG. 5A. P1, N1 and R5 form a transimpedance amplifier that is powered by REG1 "out" and buffers a photodetector's output into DED1. Similarly, P4 is a current source that is powered by REG2 "out" and modulated by DED2 and drives a VCSEL or LED diode. REG2 in FIG. 5B operates in a manner similar to REG2 as seen in FIG. 5A that utilizes inductive power tapping from the HDMI standard TMDS or FRL ports. P3, N3 and R6 form a transimpedance amplifier that is powered by REG2 "out" and buffers a photodetector's output into DED2. In this embodiment, multiple HDMI communication channels are replicated on both source and sink sides using only two optical fibers.

Figure 6A:
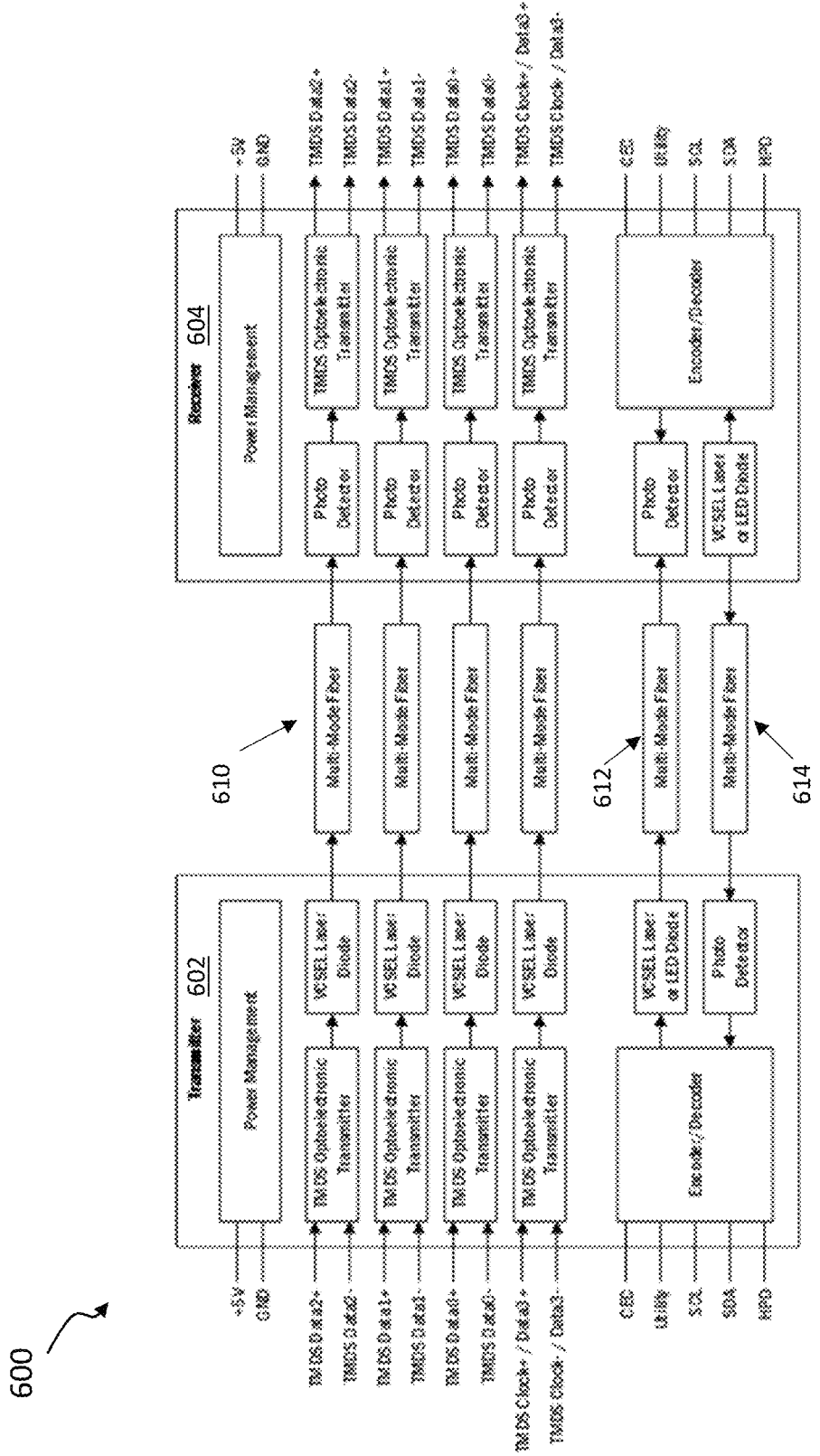
FIG. 6A illustrates all optical connections for data and control connections for an HDMI compatible interconnect.

FIG. 6A illustrates one embodiment of a HDMI compatible fully optical interconnect system 600. As illustrated, multiple multi-mode optical fiber cables 610 and 612 are used to transmit data from a transmitter 602 to a receiver 604, and at least one multi-mode optical fiber 614 that transmits signals back from the receiver 604 to the transmitter 602. In the transmitter 602, electrical HDMI standard TMDS or FRL and non-HDMI standard TMDS or FRL data are converted to optical pulses using VCSEL laser or LED diodes. A photodetector and associated circuits are used to convert received optical pulses from optical fiber 614 to electrical signals that can be processed by a connected source (not shown). The receiver 604 has multiple photodetectors and respectively connected HDMI standard TMDS or FRL optoelectronic transmitters to convert received optical pulses from optical fiber 610 and 612 to electrical signals that can be processed by a connected sink (not shown). The receiver 604 also includes a VCSEL laser or LED diode connected to an encoder/decoder to convert electrical signals to optical signals that can be sent to the transmitter 602.

Figure 6B:
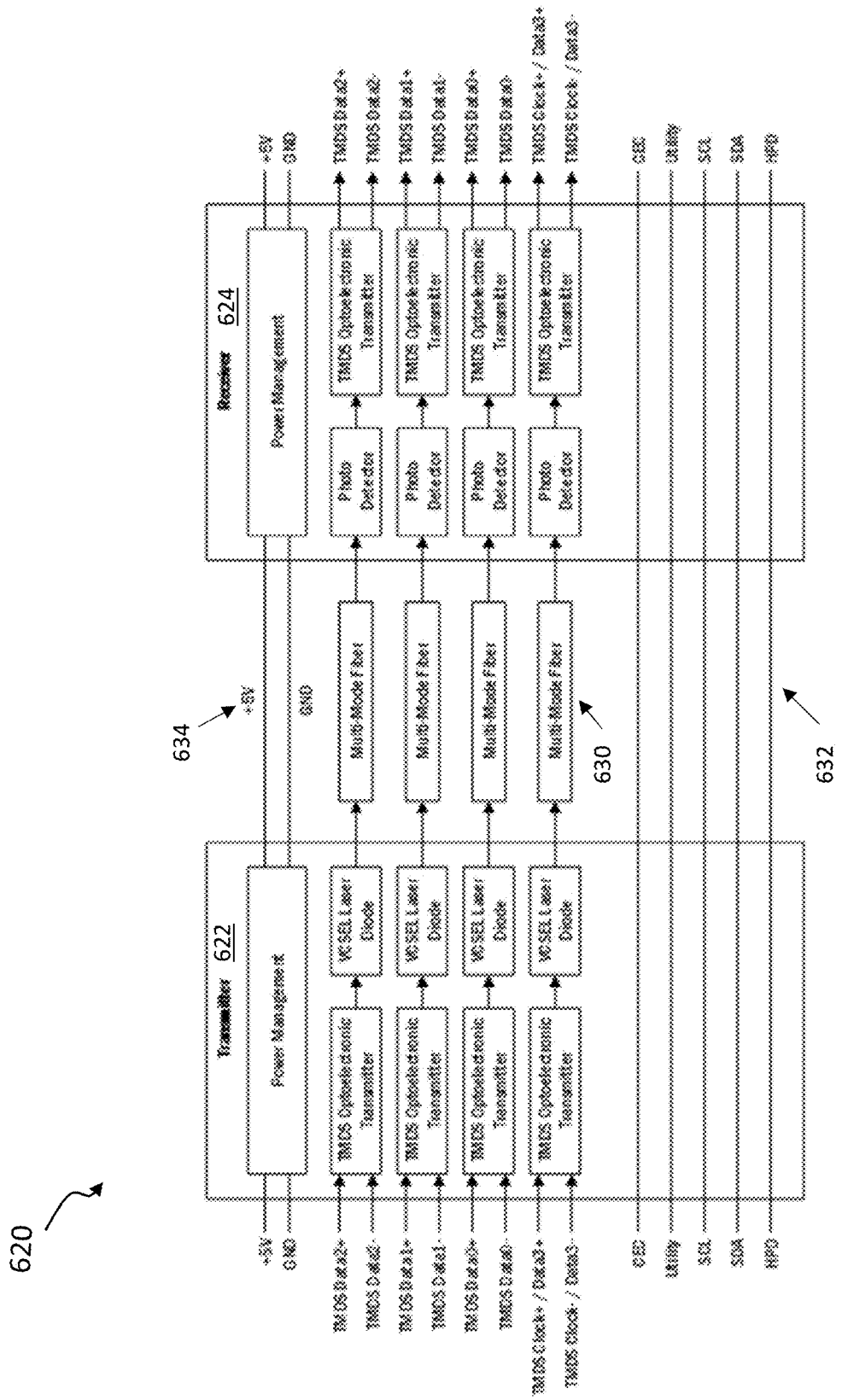
FIG. 6B illustrates optical data connections, electrical control connections, and an electrical power connection for an HDMI compatible interconnect.

FIG. 6B illustrates one embodiment of a HDMI compatible hybrid electrical and optical interconnect system 620. As illustrated, multiple multi-mode optical fiber cables 630 are used to transmit data from a transmitter 622 to a receiver 624. In the transmitter 622, electrical HDMI standard TMDS or FRL data is converted to optical pulses using VCSEL laser or other laser diodes. A photodetector and associated circuits are used to convert received optical pulses from optical fiber 634 to electrical signals that can be processed by a connected source (not shown). The receiver 624 has multiple photodetectors and respectively connected HDMI standard TMDS or FRL optoelectronic transmitters to convert received optical pulses from optical fiber 630 to electrical signals that can be processed by a connected sink (not shown). In addition to the optical connections, the system 620 also supports electrical wired connection 632 for various control and data signals. As will be understood, these connections can be unidirectional or bidirectional between transmitter 622 and receiver 624. In addition, the system includes an electrical power connection 634 connecting respective power management units of transmitter 622 and receiver 624. Advantageously, because power is available, power triggering of the HDMI connection and their associated electronics and battery systems such as described with respect to the embodiment illustrated in FIG. 5 are not necessary.

Figure 6C:
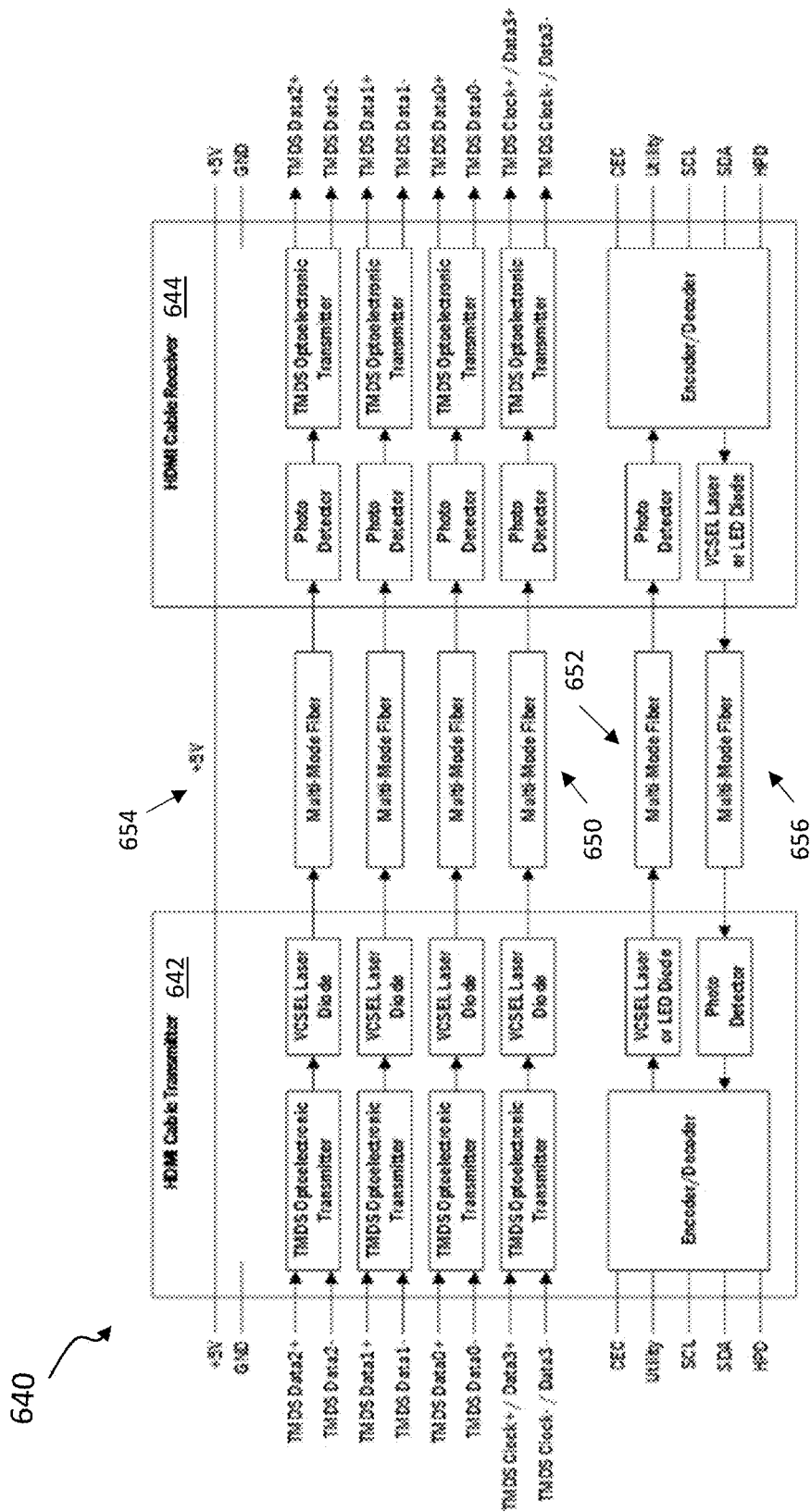
FIG. 6C illustrates all optical data and control connections and an electrical power connection for an HDMI compatible interconnect.

FIG. 6C illustrates all optical data connections and an electrical power connection for an HDMI compatible interconnect system 640. As illustrated, multiple multi-mode optical fiber cables 650 and 652 are used to respectively transmit data and control data from a transmitter 642 to a receiver 644, and as well as at least one multi-mode optical fiber 656 that transmits signals back from the receiver 644 to the transmitter 642. In the transmitter 642, electrical HDMI standard TMDS or FRL data is converted to optical pulses using VCSEL laser or LED diodes. The receiver 644 has multiple photodetectors and respectively connected HDMI standard TMDS or FRL optoelectronic transmitters to convert received optical pulses from optical fiber 650 and 652 to electrical signals that can be processed by a connected sink (not shown). The receiver 644 also includes a VCSEL laser or LED diode connected to an encoder/decoder to convert electrical signals to optical signals that can be sent to the transmitter 642 along multi-mode optical fiber 656. In addition, the system includes an electrical power connection 654 connecting transmitter 642 and receiver 644. Advantageously, because power is available, power triggering of the HDMI connection and their associated electronics and battery systems such as described with respect to the embodiment illustrated in FIG. 5 are not necessary. However, in certain embodiments, a power tap on HDMI standard TMDS or FRL ports (e.g. using inductors and regulators) can still be used to power the HDMI standard TMDS or FRL receiver or other associated circuitry.

Figure 7:
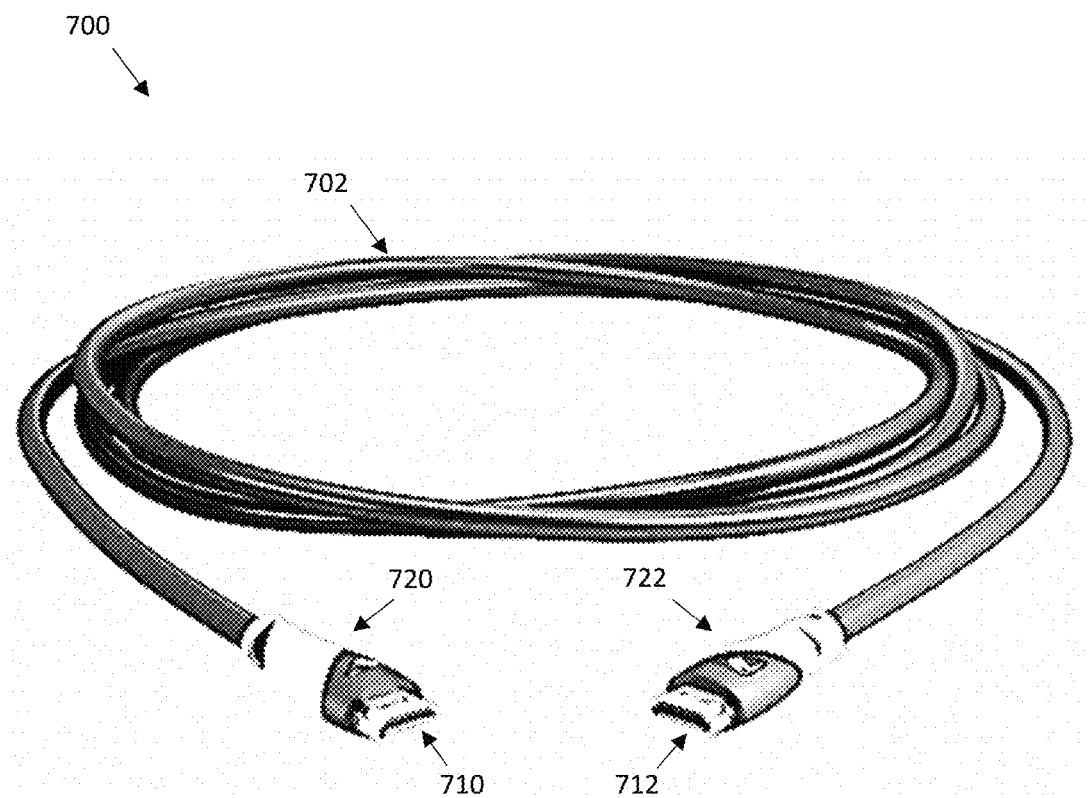
FIG. 7 illustrates one embodiment of an HDMI connector according to the disclosure.

FIG. 7 illustrates one embodiment of a HDMI compatible interconnect system 700 including bundled and loosely looped optical cables 702, and source 710 and sink 712 HDMI connectors. Signal converters 720 and 722 include housing and board layout for HDMI standard TMDS or FRL receiver, as well as other electronics supporting electrical to optical conversion or optical to electrical conversion and are located adjacent to respective HDMI connector 710 and 712.

As will be understood, the system and methods described herein can operate for interaction with devices such as servers, desktop computers, laptops, tablets, game consoles, or smart phones. Data and control signals can be received, generated, or transported between varieties of external data sources, including wireless networks, personal area networks, cellular networks, the Internet, or cloud mediated data sources. In addition, sources of local data (e.g. a hard drive, solid state drive, flash memory, or any other suitable memory, including dynamic memory, such as SRAM or DRAM) that can allow for local data storage of user-specified preferences or protocols.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A battery triggered optical data interconnect system for a source and a sink, comprising:
   a first HDMI compatible electrical connector able to receive electrical signals from the source;
   a first signal converter connected to the first HDMI compatible electrical connector and including electronics for conversion of differential electrical signals to optical signals, with the electronics including an optical conversion device;
   at least one optical fiber connected to the first signal converter;
   a second signal converter connected to the at least one optical fiber and including electronics for conversion of optical signals to differential electrical signals, the second signal converter being electrically connected to the sink via at least a first conductor and a second conductor, the first conductor and the second conductor being configured to conduct a composite signal comprising one or more differential HDMI signals and a first power signal generated by the sink, and the second signal converter including an electrical filter, a slew rate controller and a first voltage regulator,
   wherein the electrical filters the first power signal from the composite signal;
   the slew rate controller derives a second power signal from the first power signal, and controls a ramp up time of a current draw of the first voltage regulator from the sink; and
   the first voltage regulator processes the second power signal and provides power to an electrical signal amplifier; and
   a rechargeable battery module able to trigger HDMI power activation of connected differential ports, the battery module being connected to the electrical filter; and a second HDMI compatible electrical connector connected to the second signal converter and able to send signals to the sink.

2. The optical data interconnect system of claim 1 wherein the optical conversion device is a laser device driver (LDD).

3. The optical data interconnect system of claim 1 wherein the at least one optical fiber is multi-mode optical fiber.

4. The optical data interconnect system of claim 1 wherein the first HDMI compatible electrical connector is able to transmit control or other signals from the source to the sink using at least one of an electrical and an optical connection to the second HDMI compatible electrical connector and the second HDMI compatible electrical connector is able to transmit control or other signals from the sink to the source using at least one of an electrical and an optical connection to the first HDMI compatible electrical connector.

5. The optical data interconnect system of claim 1 wherein the electrical signal amplifier is a transimpedance amplifier (TIA).

6. The optical data interconnect system of claim 1 wherein the first signal converter connected to the first HDMI compatible electrical connector further comprises a photodetector, a VCSEL laser or LED diode and encoder/decoder to receive and transmit optical signals.

7. The optical data interconnect system of claim 1 wherein the second signal converter connected to the second HDMI compatible electrical connector further comprises a photodetector, a VCSEL laser or LED diode and encoder/decoder to receive and transmit optical signals.

8. The optical data interconnect system of claim 1 wherein the rechargeable battery module further comprises a second voltage regulator to supply 5 volts to a 5V pin on an HDMI port associated with the optical data interconnect system.

9. The optical data interconnect system of claim 8 wherein the rechargeable battery module is disconnected from the second voltage regulator after power is received from the sink.

10. The optical data interconnect system of claim 1 wherein the rechargeable battery module is recharged by the sink.

11. A method for operating an optical data interconnect system for a source and a sink, comprising the steps of:
  providing a first HDMI compatible electrical connector able to receive electrical signals from the source;
  converting differential signals to optical signals using a first signal converter connected to the first HDMI compatible electrical connector, the first signal converter including an optical conversion device;
  sending optical signals along at least one optical fiber connected to the first signal converter;
  receiving optical signals and converting them to differential electrical signals using electronics in a second signal converter connected to the at least one optical fiber;
  conducting a composite signal comprising one or more differential HDMI signals and a first power signal generated by the sink;
  filtering the first power signal from the composite signal by an electrical filter;
  deriving a second power signal from the first power signal by a slew rate controller, and controlling a ramp up time of a current draw of a first voltage regulator from the sink by the slew rate controller;
  processing the second power signal by the first voltage regulator and providing power to an electrical signal amplifier;
  using a rechargeable battery module able to trigger HDMI power activation of connected differential ports, the battery module being connected to the electrical filter; and
  providing a second HDMI compatible electrical connector connected to the second signal converter and able to send signals to the sink.

12. The optical data interconnect operating method of claim 11 wherein the optical conversion device is a laser device driver (LDD).

13. The optical data interconnect operating method of claim 11 wherein the at least one optical fiber is multi-mode optical fiber.

14. The optical data interconnect operating method of claim 11 wherein the first HDMI compatible electrical connector is able to transmit control or other signals from the source to the sink using at least one of an electrical and an optical connection to the second HDMI compatible electrical connector and the second HDMI compatible electrical connector is able to transmit control or other signals from the sink to the source using at least one of an electrical and an optical connection to the first HDMI compatible electrical connector.

15. The optical data interconnect operating method of claim 11 wherein the electrical signal amplifier is a transimpedance amplifier (TIA).

16. The optical data interconnect operating method of claim 11 wherein the first signal converter connected to the first HDMI compatible electrical connector further comprises a photodetector, a VCSEL laser or LED diode and encoder/decoder to receive and transmit optical signals.

17. The optical data interconnect operating method of claim 11 wherein the second signal converter connected to the second HDMI compatible electrical connector further comprises a photodetector, a VCSEL laser or LED diode and encoder/decoder to receive and transmit optical signals.

18. The optical data interconnect operating method of claim 11 wherein the rechargeable battery module further comprises a second voltage regulator to supply 5 volts to a 5V pin on a HDMI port.

19. The optical data interconnect system of claim 11 wherein the rechargeable battery module is disconnected from the second voltage regulator after power is received from the sink.

20. The optical data interconnect operating method of claim 11 wherein the rechargeable battery module is recharged by the sink.

21. An optical data interconnect system for a source and a sink, comprising:
  a first electrical connector able to receive electrical signals from the source;
  a first signal converter connected to the first electrical connector and including electronics for conversion of electrical signals to optical signals, with the electronics including an optical conversion device;
  at least one optical fiber connected to the first signal converter;
  a second signal converter connected to the at least one optical fiber and including electronics for conversion of optical signals to electrical signals, the second signal converter being electrically connected to the sink via at least a first conductor and a second conductor, the first conductor and the second conductor being configured to conduct a composite signal comprising one or more differential HDMI signals and a first power signal generated by the sink, and the second signal converter including an electrical filter, a slew rate controller and a first voltage regulator;
  wherein the electrical filters the first power signal from the composite signal;
  the slew rate controller derives a second power signal from the first power signal, and controls a ramp up time of a current draw of the first voltage regulator from the sink; and
  the first voltage regulator processes the second power signal and provides power to an electrical signal amplifier;
  a rechargeable battery module able to trigger power activation of connected ports, the battery module being connected to the electrical filter; and
  a second electrical connector connected to the second signal converter and able to send signals to the sink.

* * * * *

UNITED STATES PATENT AND TRADEMARK OFFICE
CERTIFICATE OF CORRECTION

PATENT NO. : 11,233,581 B2
APPLICATION NO. : 16/817335
DATED : January 25, 2022
INVENTOR(S) : Yun Bai et al.

Page 1 of 1

It is certified that error appears in the above-identified patent and that said Letters Patent is hereby corrected as shown below:

In the Specification

In Column 5, Line 2, the word "and" should be deleted.
In Column 6, Line 3, there should be a --.-- after the word SATA.
In Column 9, Line 31, RXSV should be RX5V.

In the Claims

In Column 12, Line 27, the word filter should be added after the word electrical.
In Column 14, Line 46, the word filter should be added after the word electrical.

Signed and Sealed this
Tenth Day of May, 2022

Katherine Kelly Vidal
*Director of the United States Patent and Trademark Office*